(12) United States Patent
Chang et al.

(10) Patent No.: US 8,883,597 B2
(45) Date of Patent: Nov. 11, 2014

(54) METHOD OF FABRICATION OF A FINFET ELEMENT

(75) Inventors: Cheng-Hung Chang, Hsinchu (TW); Chen-Hua Yu, Hsin-Chu (TW); Chen-Nan Yeh, Hsi-Chih (TW); Chu-Yun Fu, Taipei (TW); Yu-Rang Hsu, Tainan (TW); Ding-Yuan Chen, Taichung (TW)

(73) Assignee: Taiwan Semiconductor Manufacturing Company, Ltd., Hin-Chu (TW)

( * ) Notice: Subject to any disclaimer, the term of this patent is extended or adjusted under 35 U.S.C. 154(b) by 1188 days.

(21) Appl. No.: 11/831,098

(22) Filed: Jul. 31, 2007

(65) Prior Publication Data

US 2009/0035909 A1    Feb. 5, 2009

(51) Int. Cl.
*H01L 21/8236* (2006.01)
*H01L 21/8238* (2006.01)
*H01L 29/78* (2006.01)
*H01L 29/66* (2006.01)

(52) U.S. Cl.
CPC  *H01L 21/823828* (2013.01); *H01L 21/823821* (2013.01); *H01L 21/823807* (2013.01); *H01L 29/785* (2013.01); *H01L 29/66795* (2013.01); *H01L 21/823857* (2013.01)
USPC .......................................... 438/276; 257/365

(58) Field of Classification Search
USPC ........................................ 438/276, 565–569
See application file for complete search history.

(56) References Cited

U.S. PATENT DOCUMENTS

| | | | |
|---|---|---|---|
| 5,902,127 A * | 5/1999 | Park | 438/435 |
| 6,090,690 A * | 7/2000 | Moslehi | 438/513 |
| 6,361,874 B1 * | 3/2002 | Yu | 428/514 |
| 6,413,802 B1 | 7/2002 | Hu et al. | |
| 6,706,571 B1 | 3/2004 | Yu et al. | |
| 6,858,478 B2 | 2/2005 | Chau et al. | |
| 7,190,050 B2 | 3/2007 | King et al. | |
| 7,235,436 B1 * | 6/2007 | Lin et al. | 438/154 |
| 7,247,887 B2 | 7/2007 | King et al. | |
| 7,265,008 B2 | 9/2007 | King et al. | |
| 7,470,632 B2 * | 12/2008 | Hill et al. | 438/778 |
| 7,508,031 B2 | 3/2009 | Liu et al. | |
| 7,528,465 B2 | 5/2009 | King et al. | |
| 7,605,449 B2 | 10/2009 | Liu et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |

(Continued)

OTHER PUBLICATIONS

Quirk, Michael, and Julian Serda, Semiconductor Manufacturing Technology, Upper Saddle River, NJ: Prentice Hall, 2001.*

(Continued)

*Primary Examiner* — Mark Tornow
(74) *Attorney, Agent, or Firm* — Haynes and Boone, LLP (57) ABSTRACT

The present disclosure provides a method of fabricating a FinFET element including providing a substrate including a first fin and a second fin. A first layer is formed on the first fin. The first layer comprises a dopant of a first type. A dopant of a second type is provided to the second fin. High temperature processing of the substrate is performed on the substrate including the formed first layer and the dopant of the second type.

12 Claims, 11 Drawing Sheets

(56) References Cited

U.S. PATENT DOCUMENTS

| | | |
|---|---|---|
| 2007/0228372 A1 | 10/2007 | Yang et al. |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |

OTHER PUBLICATIONS

Chinese Office Action issued by the Chinese Patent Office on Oct. 16, 2009, Application No. 200710167852, 7 pages.

Bartlomiej Jan Pawlak, et al., U.S. Appl. No. 12/569,689, "Method of Fabricating Finfet Device," filed Sep. 29, 2009, 21 pages.

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12/840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

\* cited by examiner

METHOD OF FABRICATION OF A FINFET ELEMENT

BACKGROUND

The present disclosure relates generally to the field of fabrication of semiconductor devices, and more specifically to a method of fabricating a fin type field effect transistor (FinFET).

Double-gate MOSFETs are MOSFETs that incorporate two gates into a single device. These devices are also known as FinFETs due to their structure including a thin "fin," extending from a substrate. FinFETs may be fabricated using conventional MOSFET technology. A typical FinFET is fabricated on a silicon layer with an overlying insulating layer and the device extends from the insulating layer as a fin of silicon. The channel of the FET is formed in this vertical fin. A double gate is provided over the fin. The double gate is beneficial in that there is a gate on both sides of the channel allowing gate control of the channel from both sides. Further advantages of FinFETs include reducing the short channel effect and higher current flow. Other FinFET architectures may include three or more effective gates.

Current FinFET technology has challenges however. For example, ion implantation is typically used to form a lightly doped drain (LDD). Ion implantation creates a non-conformal doping profile of the fin (for example, heavier doping at the top of the fin than the bottom of the fin, which is found closer to the substrate) however. This non-conformal doping profile may create issues including those associated with short channel effects. By using a tilt implant, the uniformity may be improved, but shadowing effects will be disadvantageous. Plasma immersion ion implantation has an ion energy such that it may be too low to satisfy FinFET device performance requirements.

As such, an improved fabrication method for a FinFET element is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to a method of fabricating a FinFET element. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1:
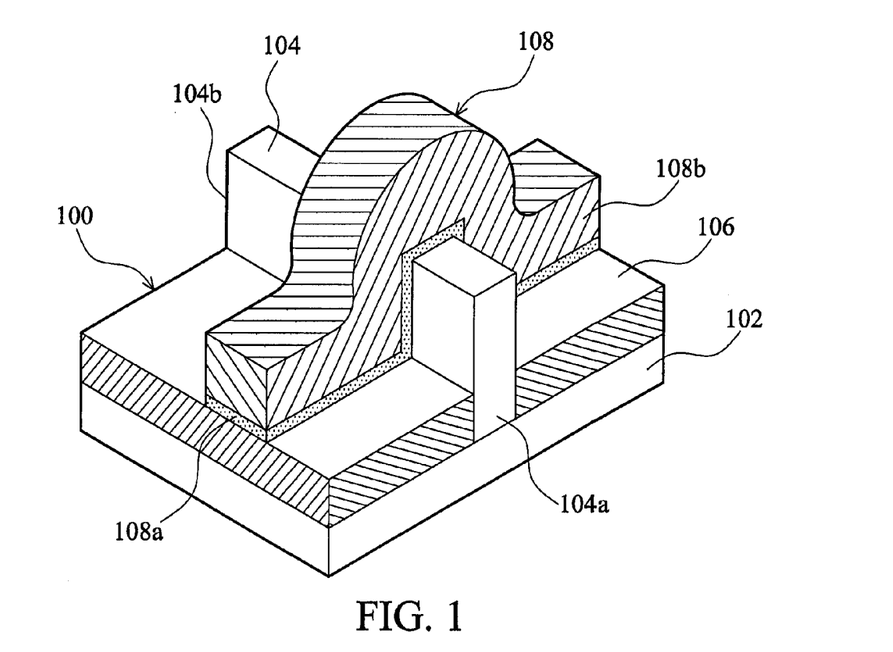
FIG. 1 is a perspective view illustrating an embodiment of a FinFET element.

Referring to FIG. 1, illustrated is an embodiment of a FinFET element 100. The FinFET element 100 includes a substrate 102, an insulative layer 106, a fin 104, and a gate structure 108. In an embodiment, the substrate 102 includes a silicon substrate. Other examples of materials that may be suitable for use in the substrate include silicon-on-insulator (SOI), silicon-germanium (SiGe), germanium, and/or compound semiconductor materials. The insulative layer 106 may include shallow trench isolation (STI) structures formed on the substrate 102. The STI apertures may be etched using conventional processes such as reactive ion etch after photolithography patterning. The apertures may then be filled with an insulator material, such as an oxide. In an embodiment, the process includes chemical vapor deposition (CVD) of oxide to fill an STI aperture, and continues with a chemical-mechanical polish (CMP) process to planarize the oxide. Processes, such as, photolithography and etch processes (and trimming techniques) known in the art, may be used to create the fin 104. The fin 104 may comprise silicon. In an embodiment, an oxidation process and/or an $H_2$ anneal process may be performed after the formation of the fin 104. The oxidation process and/or an $H_2$ anneal process may repair damage to the fin surface that occurred during the etch process. The oxide may be sacrificial. The fin 104 includes the channel of the FinFET element 100. The fin 104 at a position designated reference number 104a may be coupled to the source of the FinFET element 100, and/or the fin 104 may include the source at the position 104a. The fin 104 at a position designated reference number 104b may be coupled to the drain of the FinFET element 100, and/or the fin 104 may include the drain at the position 104b. A gate structure 108 is formed on and over the fin 104. The gate structure 108 includes a gate dielectric 108a and a gate electrode 108b. The gate dielectric 108a may be grown or deposited using processes known in the art. The gate dielectric 108a includes dielectric material such as, silicon oxide, silicon nitride, silicon oxinitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, and/or combinations thereof. A gate electrode 108b may be deposited on the gate dielectric 108a. The gate electrode 108b may include polysilicon, silicon-germanium, a metal including metal compounds such as, Mo, Cu, W, Ti, Ta, TiN, TaN, NiSi, CoSi, and/or other suitable conductive materials known in the art. The FinFET element 100 may include additional structures such as spacers.

The gate structure 108 illustrates a double gate structure of the FinFET element 100. In addition, various other FinFET architectures are known in the art, such as those with more than two effective gates, and are within the scope of this disclosure. The FinFET element 100 may be formed using one or more of the methods described herein as FIGS. 2, 3, 5, and/or 7. In an embodiment, the FinFET element 100 is a P-FinFET (PMOS FinFET) including a positively doped channel. In the embodiment, the fin 104 is doped with P-type dopants such as, boron. In an alternative embodiment, the FinFET element 100 is an N-FinFET (NMOS FinFET) including a negatively doped channel. In the embodiment, the fin 104 is doped with N-type dopants such as phosphorus. The FinFET element 100 may be one of a plurality of FinFET elements formed on a single substrate, the substrate including N-FinFET and P-FinFET elements.

Figure 2:
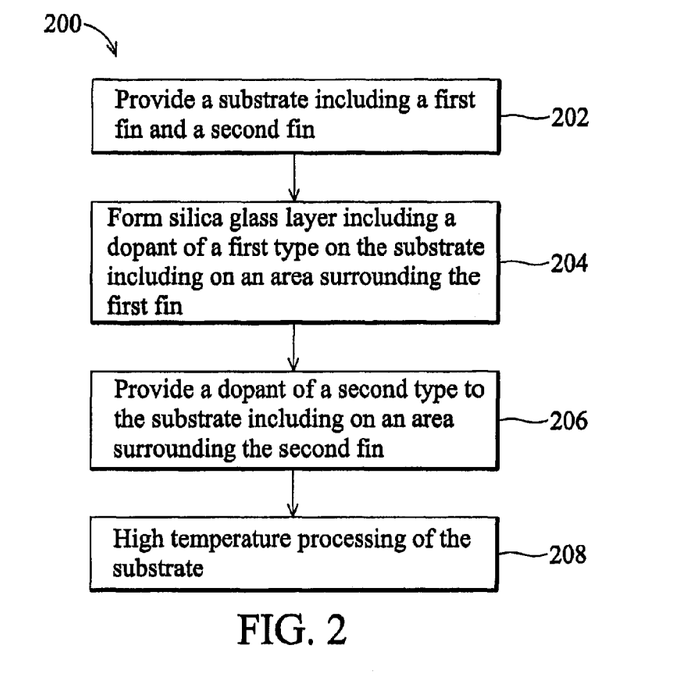
FIG. 2 is a flowchart illustrating an embodiment of a method of fabricating a FinFET element.

Referring now to FIG. 2, illustrated is a method 200, an embodiment of a method for fabricating a FinFET element, such as the FinFET element 100, described above with reference to FIG. 1. The method 200 may be used to dope a fin of the FinFET element, such as the fin 104, also described above with reference to FIG. 1. The method 200 may be used to form a portion of multiple FinFET elements present on the same substrate, including doping a fin of an N-FinFET element and a fin of an adjacent P-FinFET element. Thus the method 200 may be utilized form the lightly doped drain (LDD) and/or source/drain doped regions of one or more FinFET elements on a substrate.

The method 200 begins with step 202 where a substrate is provided including a first fin and a second fin. The substrate may be substantially similar to the substrate 102, described above with reference to FIG. 1. The first fin and/or the second fin may be substantially similar to the fin 104, also described above with reference to FIG. 1. In an embodiment, the first fin is a portion of an N-FinFET element and the second fin is a portion of a P-FinFET element.

The method 200 proceeds to step 204 were a silica glass layer is formed on the substrate. Specifically, the silica glass layer is formed on and over (surrounding) an area including the first fin. In an embodiment, the silica glass may be deposited over a plurality of fins and etched such that the layer is removed from one or more fins using conventional processes, but remains in an area surrounding the first fin. The formed silica glass layer includes a dopant of a first type. The dopant may be positive type (P-type) or negative type (N-type). In an embodiment, the dopant type is N-type and the silica glass comprises phosphosilicate glass (PSG), or phosphorus doped silicon glass. In the embodiment, the N-type dopant is phosphorus. In an alternative embodiment, the dopant type is P-type and the silica glass may be comprised of borosilicate glass (BSG), or boron doped silicon glass. In the embodiment, the P-type dopant is boron.

The method 200 proceeds to step 206 where a dopant of a second type is provided to the substrate including to a second fin on the substrate. In an embodiment, the dopant is provided by depositing a layer of silica glass including a dopant of a second type on the substrate. They layer is distinct from the layer of silica glass comprising the first dopant formed in step 204, described above. The layer may be deposited by conventional processes known in the art such as chemical vapor deposition (CVD), plasma enhanced CVD, physical vapor deposition, and/or other deposition method known in the art. In an embodiment, the dopant included in the silica glass is a P-type dopant. In a further embodiment, the P-type dopant is boron and the layer deposited is borosilicate glass (BSG).

In an alternative embodiment, the dopant is provided by diffusing the dopant into the substrate using vapor phase processing. In the vapor phase process, a dopant in gaseous form may be provided to the environment of the substrate. Due to the concentration gradient, the dopant diffuses into the substrate forming a diffusion layer (layer of including diffused dopants) at the surface of the substrate. In the embodiment, the diffusion may be performed by conventional vapor phase processes known in the art. The time and temperature of the process may vary with the dopant type. The dopant provided may be N-type or P-type. In an embodiment, the dopant is N-type and the dopant is phosphorus. Other examples of possible N-type dopants include arsenic and antimony. In an alternative embodiment, the dopant is P-type and the dopant is boron. Other examples of possible P-type dopants include aluminum.

The method 200 then continues to step 208 where the substrate is subjected to high temperature processing, such as annealing. The step 208 may include a rapid thermal anneal (RTA) process. In an embodiment, the RTA process is at approximately 1000 C for approximately 10 seconds. The anneal process may drive the dopants into the first fin and/or the second fin. The anneal process allows solid phase diffusion (drive-in) of dopants from the silica glass layer formed in step 204 into a first fin on the substrate. The anneal process may also drive-in the dopants introduced in the vapor phase diffusion provided in step 204. In an embodiment, the method 200 continues from step 208 to remove one or more layers on the substrate, such as the silica layer formed in step 204.

Additionally, the method 200 may be performed in a different sequence. The method 200 may include steps not described above, such as forming additional layers, for example, protective oxide layers, removal of layers, for example, removal of silica layers after annealing, pre-amorphization implant (PAI) processes, and/or other processes known in the art. The method 200 may continue to include the fabrication of one or more gate structures on the substrate. The gate structures may be substantially similar to the gate structure 108, described above with respect to FIG. 1.

Figure 3:
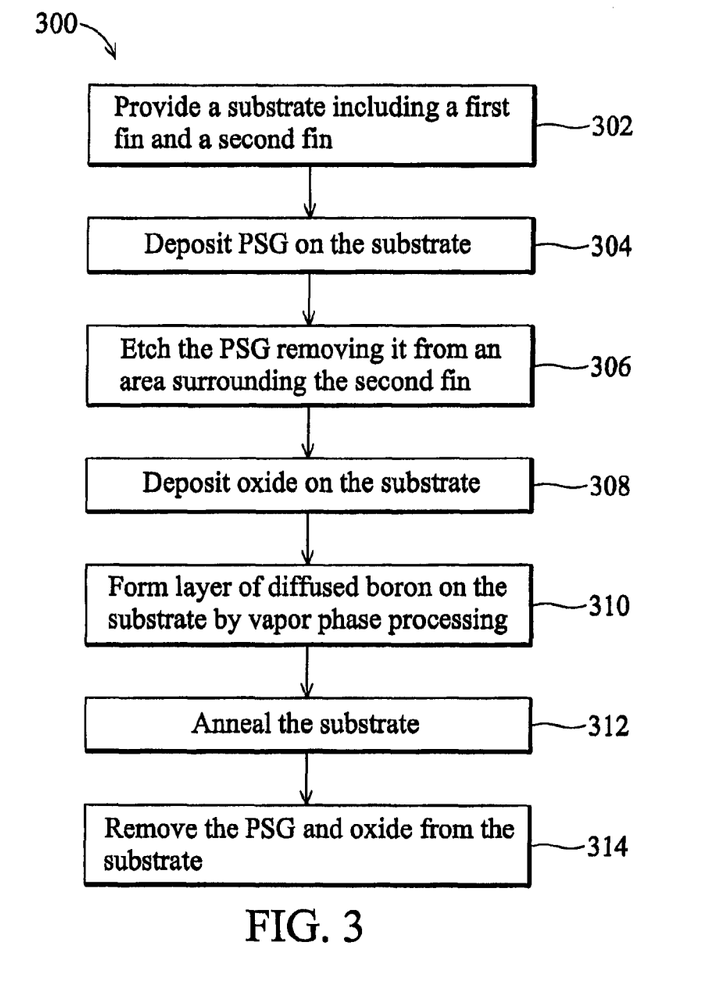
FIG. 3 is a flow chart illustrating an embodiment of the method of FIG. 2.

FIG. 3 illustrates a method 300 of fabricating a of doping a FinFET element, which is an embodiment of the method 200, described above with reference to FIG. 2; FIGS. 4a, 4b, 4c, 4d, 4e, and 4f illustrate incremental modifications of a substrate 400 that correspond to the steps of FIG. 3. The method 300 begins at step 302 where a substrate is provided that includes a first fin and a second fin. Referring to the example of FIG. 4a, the substrate 400 is provided. The substrate 400 may be substantially similar to the substrate 100, described above with reference to FIG. 1. Located on the substrate are STI regions 402a, 402b, and 403c. To form the STI regions 402a, 402b, and 403c, the substrate 400 may be patterned and etched using conventional processes to create apertures; the apertures may then be filled with an insulator material, such as an oxide. In an embodiment, the process includes conformal LPCVD oxide deposition to fill an STI aperture and continues with a CMP process to planarize the oxide. A fin 404 and a fin 406 are located on the substrate 400. The first fin 404 and/or the second fin 406 may be substantially similar to the fin 104, described above with reference to FIG. 1. In an embodiment, the substrate 400 and the fins 304 and 306 include silicon. In the illustrated embodiment, the fin 404 forms a portion of an N-FinFET element and the fin 406 forms a portion of a P-FinFET element. The fin 406 may be doped with P-type dopants to create the channel of an P-FinFET element; the fin 404 may be doped with N-type dopants to create the channel of a N-FinFET element.

Figure 4A:
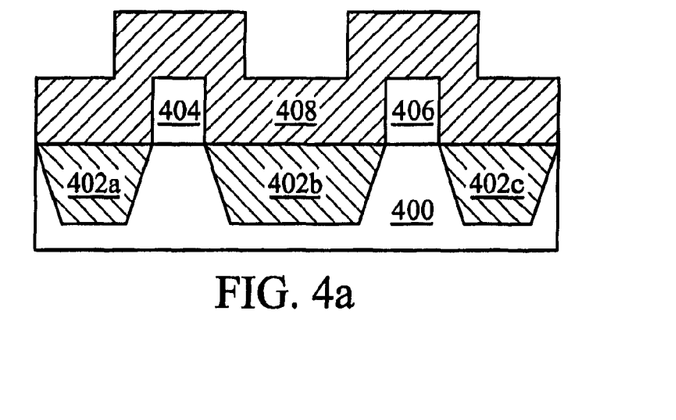
FIGS. 4a-4f are cross-sections illustrating an embodiment of the method of FIG. 2.
Figure 4B:
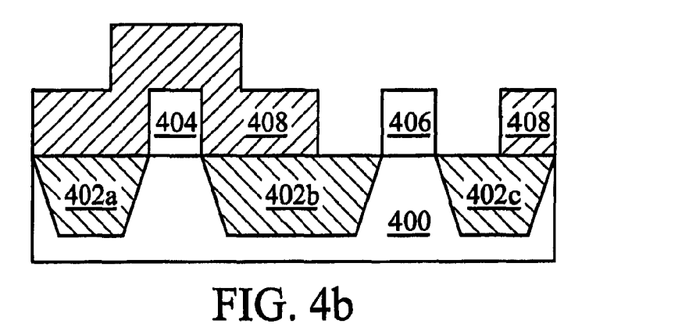

The method 300 proceeds to step 304 where a phosphosilicate glass (PSG) layer is formed on the substrate. In the example of FIG. 4a, a PSG layer 408 is deposited on the substrate 400. The PSG layer 408 surrounds the fins 406 and 404. The PSG layer 408 may include plasma-enhanced PSG (PE-PSG). In an embodiment, approximately 500 Å to 1000 Å of PE-PSG is deposited. The method 300 proceeds to step 306 where the PSG is removed from the P-FinFET element area, and in particular the fin of the P-FinFET element. In the example of FIG. 4b, the PSG layer 408 is removed from the area surrounding the fin 406. The area surrounding the fin 406 includes the P-FinFET element area, for example, the location of the source and drain of the P-FinFET element. The PSG layer 408 may be removed by conventional processes such as photolithography patterning followed by wet or dry etching processes.

Figure 4C:
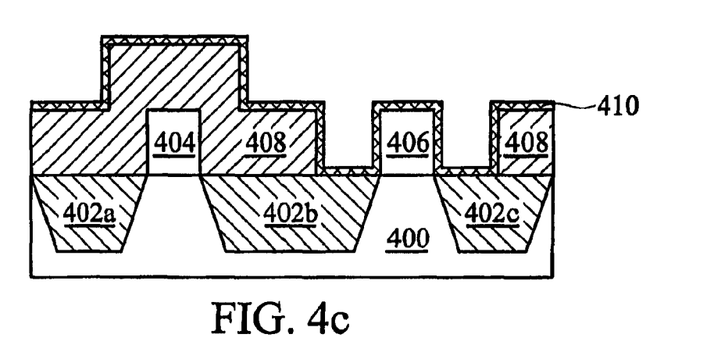

The method 300 proceeds to step 308 where an oxide layer is formed on the substrate. In an embodiment of the method 300, step 308 is omitted. In the example of FIG. 4c, the oxide layer 410 is formed on the substrate 400. In an embodiment, between approximately 10 Angstroms (Å) and approximately 30 Å of oxide are formed. The oxide layer 410 may be formed by growing the oxide, depositing the oxide, and/or other processes known in the art.

Figure 4D:
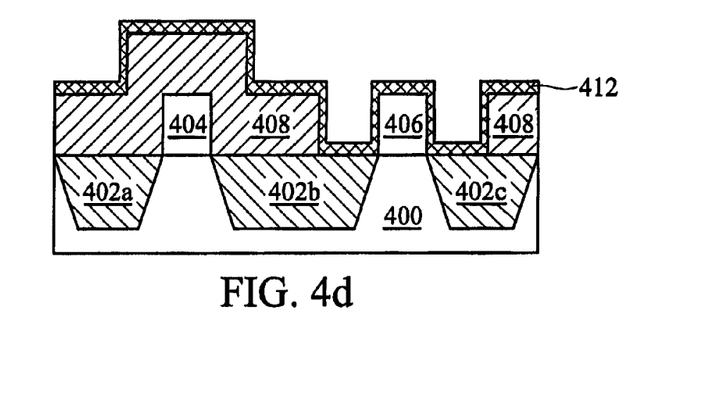

The method 300 proceeds to step 310 where boron in its vapor phase is introduced to the substrate. A diffusion layer including boron is formed by diffusion of boron into the substrate by vapor phase processing (doping process). In the example of FIG. 4d, the diffusion layer 412 comprising boron forms on the substrate 400. The properties of the diffusion layer, including thickness, are dependent upon the time and temperature of the diffusion process.

Figure 4E:
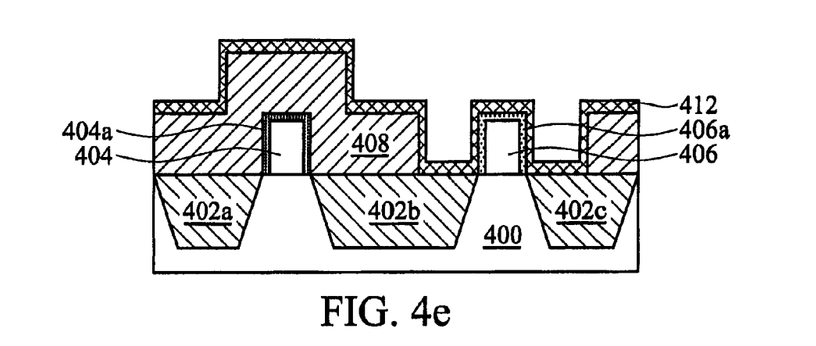

The method 300 proceeds to step 312 where the substrate is annealed. The annealing process may allow solid phase diffusion (drive-in) of the dopants present in the PSG layer. The annealing may also drive-in the dopants present in the diffusion layer. Referring to the example of FIG. 4e, the annealing process allows solid phase diffusion of the phosphorus present in the PSG layer 408 into the fin 404, shown as region 404a. It also allows the boron present in the diffusion layer 412 to be driven into the fin 406, shown as region 406a. Thus, the fin 404 is N-doped and the fin 406 is P-doped. As such, the method 300 provides a solid phase diffusion process for forming a portion of an NMOS FinFET and a vapor phase diffusion process for forming a portion of a PMOS FinFET.

Figure 4F:
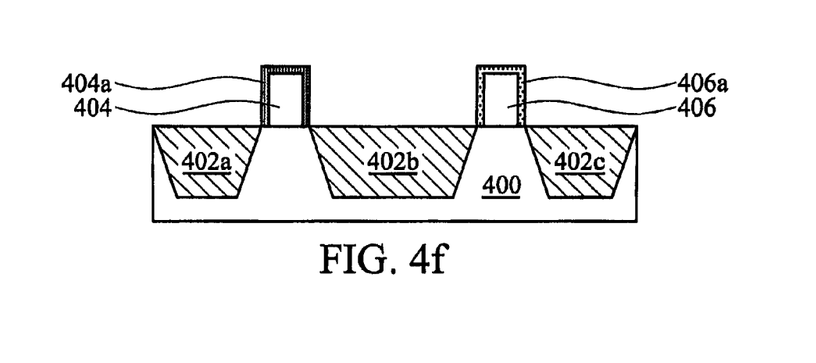

The method 300 proceeds to step 314 where the PSG and/or the oxide layer, may be removed from the substrate. In an embodiment of the method 300, step 314 is omitted. Referring to the example of FIG. 4f, the PSG layer 408 and the oxide layer 410 are removed from the substrate 400. In the illustrated embodiment, the STI structures 402b and 402c are partially etched in the removal of the oxide layer 410 from the substrate 400.

Figure 5:
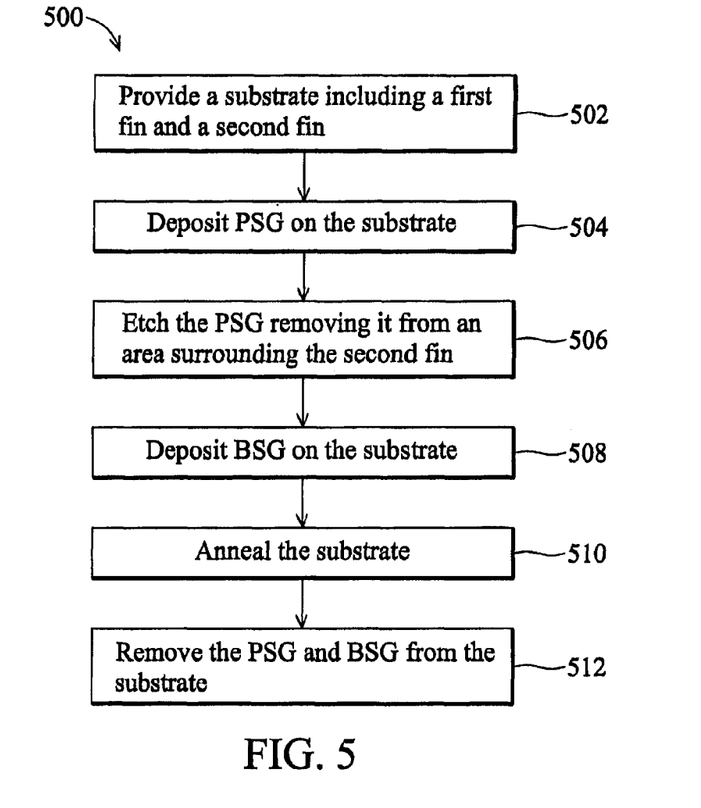
FIG. 5 is a flow chart illustrating an embodiment of the method of FIG. 2.

FIG. 5 illustrates a method of fabricating a FinFET element, which is an embodiment of the method 200, described above with reference to FIG. 2; FIGS. 6a, 6b, 6c, 6d, and 6e illustrate incremental modifications of a substrate 600 that correspond to the steps of FIG. 5.

The method 500 begins at step 502 where a substrate is provided that includes a first fin and a second fin. Referring to the example of FIG. 6a, the substrate 600 is provided. The substrate 600 may be substantially similar to the substrate 100, described above with reference to FIG. 1. Located on the substrate are STI regions 602a, 602b, and 602c. To form the STI regions 602a, 602b, and 602c, the substrate 600 may be patterned and etched using conventional processes to create apertures; the apertures may then be filled with an insulator material, such as an oxide. In an embodiment, the process includes conformal LPCVD oxide deposition to fill an STI aperture, and continues with a CMP process to planarize the oxide. A fin 604 and a fin 606 are located on the substrate 600. The first fin 604 and/or the second fin 606 may be substantially similar to the fin 104, described above with reference to FIG. 1. In an embodiment, the substrate 600 and the fins 604 and 606 include silicon. In the illustrated embodiment, the fin 604 is a portion of an N-FinFET element and the fin 606 is a portion of the P-FinFET element. The fin 604 may be doped with N-type dopants to form a channel of an N-FinFET element. The fin 606 may be doped with P-type dopants to form the channel of a P-FinFET element.

Figure 6A:
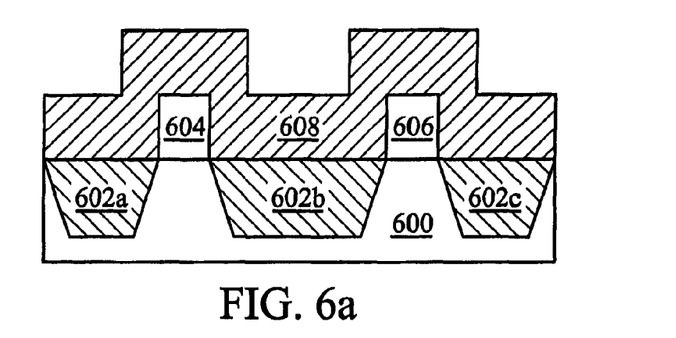
FIGS. 6a-6e are cross-sections illustrating an embodiment of the method of FIG. 5.
Figure 6B:
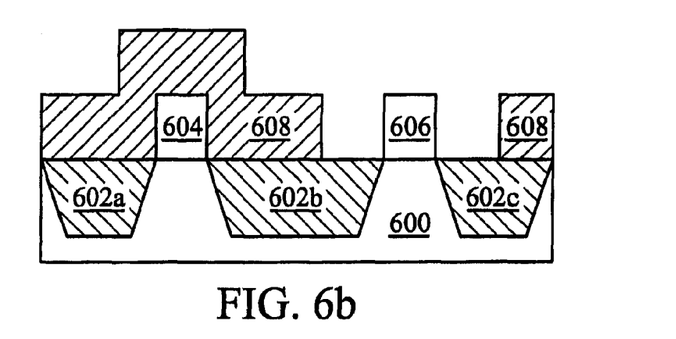

The method 500 proceeds to step 504 where a phosphosilicate glass (PSG) layer is formed on the substrate. In the example of FIG. 6a, a PSG layer 608 is deposited on the substrate 600 encapsulating the fins 606 and 604. The PSG layer 608 may include plasma-enhanced PSG (PE-PSG). In an embodiment, approximately 500 Å to 1000 Å of PE-PSG is deposited. The method 500 proceeds to step 506 where the PSG is removed from the P-FinFET element area, and in particular the area surrounding the fin of the P-FinFET element. In the example of FIG. 6b, the PSG layer 608 is removed from the area surrounding the fin 606. The area surrounding the fin 606 includes the P-FinFet element area, for example, the location of the source and drain of the P-FinFET element. The PSG layer 408 may be removed by conventional processes such as photolithography patterning, followed by wet or dry etching processes.

Figure 6C:
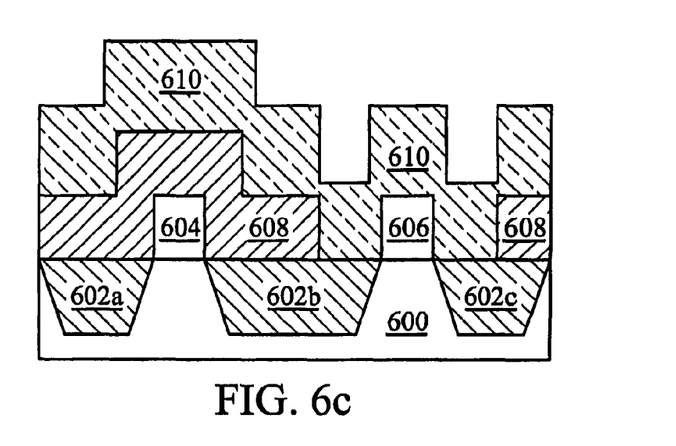
Figure 6D:
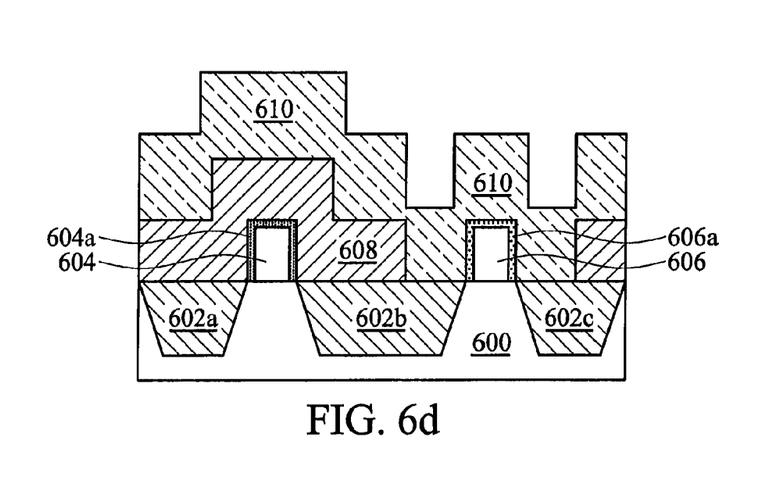
Figure 6E:
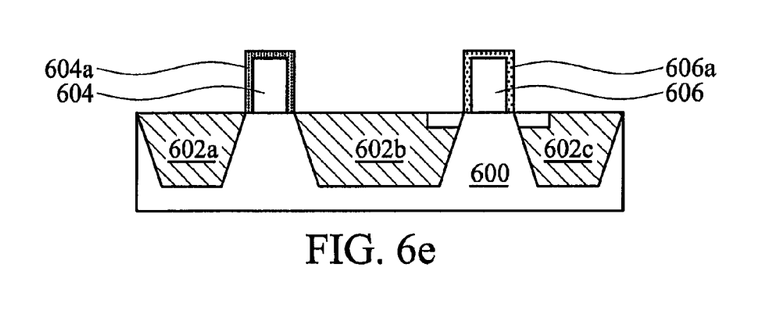

The method 500 proceeds to step 508 where borosilicate glass (BSG) is deposited on the substrate, including on and over (surrounding) a second fin of the substrate. In the example of FIG. 6c, the BSG layer 610 is deposited on the substrate 600. In an embodiment, the BSG layer 610 is a plasma-enhanced BSG layer. The method 500 proceeds to step 510 where the substrate is annealed. The annealing process may allow the solid phase diffusion (driving-in) of the dopants present in the PSG layer and the BSG layer. In the example of FIG. 6d, the annealing process allows solid phase diffusion of the phosphorus present in the PSG layer 608 into the fin 604, creating the doped region 604a. It also allows the solid phase diffusion of the boron present in the BSG layer 610 into the fin 606, creating the doped region 606a. Thus, the fin 604 becomes N-doped and the fin 606 becomes P-doped. Therefore, the method 500 provides a solid phase diffusion process for forming a portion of an NMOS FinFET element and a solid phase diffusion process for forming a portion of a PMOS FinFET element.

The method 500 proceeds to step 512 where the PSG and/or BSG layers may be removed from the substrate. In an embodiment of the method 500, step 512 is omitted. Referring to the example of FIG. 6e, the PSG layer 608 and the BSG layer 610 are removed from the substrate 600. In the illustrated embodiment, the STI structures 602b and 602c are partially etched in the removal of the BSG layer 610 from the substrate 600.

Figure 7:
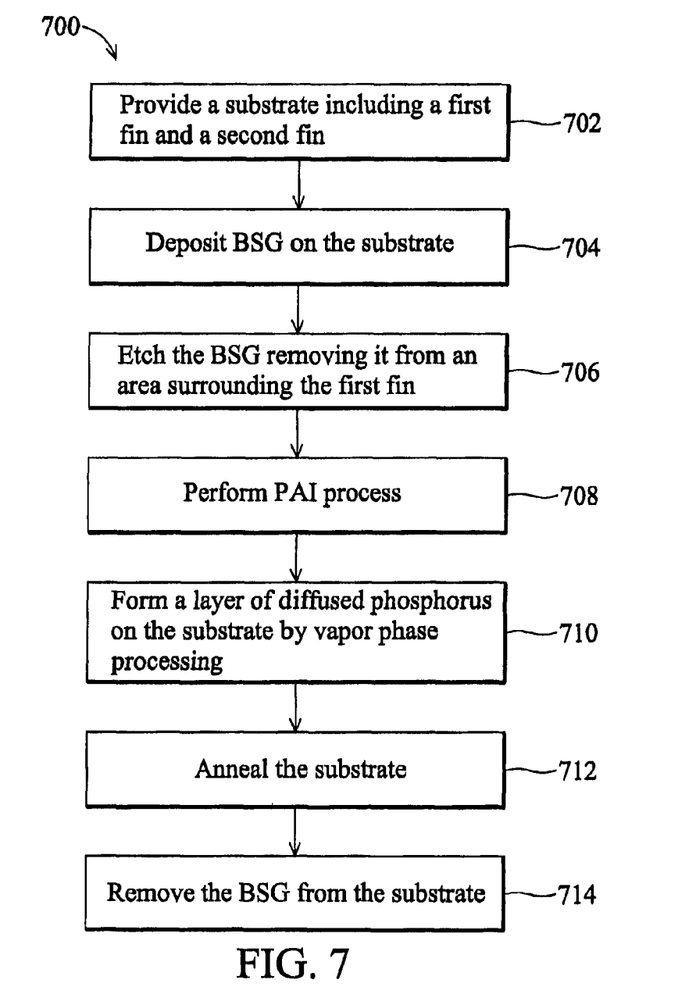
FIG. 7 is a flow chart illustrating an embodiment of the method of FIG. 2.

FIG. 7 illustrates a method 700 of fabrication a FinFET element, which is an alternative embodiment of the method 200, described above with reference to FIG. 2; FIGS. 8a, 8b, 8c, 8d, 8e, and 8f illustrate incremental modifications of a substrate 800 that correspond to the steps of FIG. 7.

The method 700 begins at step 702 where a substrate is provided that includes a first fin and a second fin. Referring to the example of FIG. 8a, the substrate 800 is provided. The substrate 800 may be substantially similar to the substrate 100, described above with reference to FIG. 1. Located on the substrate 800 are STI regions 802a, 802b, and 802c. To form the STI regions 802a, 802b, and 802c, the substrate 800 may be patterned and etched using conventional processes to create apertures; the apertures may then be filled with an insulator material, such as an oxide. In an embodiment, the process includes conformal LPCVD oxide deposition to fill an STI aperture, and continues with a CMP process to planarize the oxide. A fin 804 and a fin 806 are located on the substrate 800. The first fin 804 and/or the second fin 806 may be substantially similar to the fin 104, also described above with reference to FIG. 1. In an embodiment, the substrate 800 and the fins 804 and 806 include silicon. In the illustrated embodiment, the fin 804 forms a portion an N-FinFET element and fin 806 forms a portion of a P-FinFET element. The fin 804 may form the N-doped channel of the N-FinFET element; the fin 806 may form the P-doped channel of the P-FinFET device.

Figure 8A:
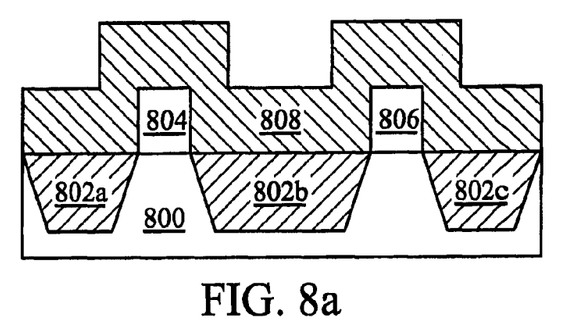
FIGS. 8a-8f are cross-sections illustrating an embodiment of the method of FIG. 7.
Figure 8B:
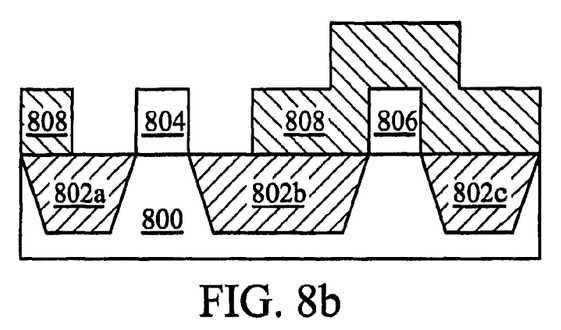
Figure 8C:
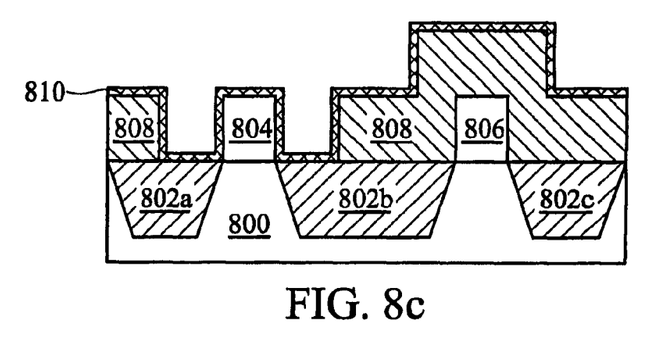

The method 700 proceeds to step 704 where a borosilicate glass (BSG) layer is formed on the substrate. In the example of FIG. 8a, a BSG layer 808 is deposited on the substrate 800. The BSG layer 808 surrounds the fins 806 and 804. The BSG layer 808 may include plasma-enhanced BSG (PE-BSG). The method 300 proceeds to step 806 where the BSG is removed from the N-FinFET element area, in particular from the area surrounding the fin of the N-FinFET element. In the example of FIG. 8b, the BSG layer 808 is removed from the area surrounding the fin 804. The area surrounding the fin 804 includes the N-FinFet element area, for example, the location of the source and drain of the N-FinFET element. The BSG layer 808 may be removed by conventional processes such as photolithography patterning followed by wet or dry etching processes.

Figure 8D:
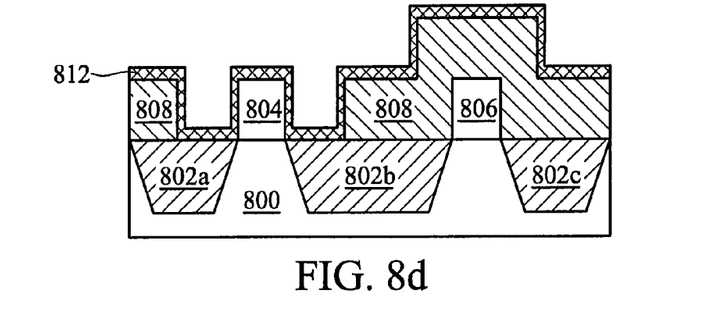
Figure 8E:
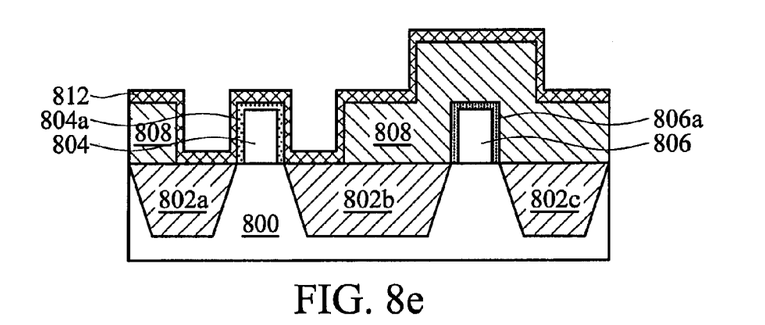
Figure 8F:
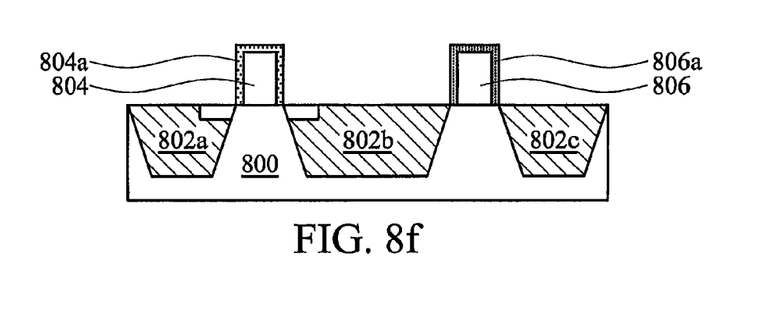

The method 700 proceeds to step 708 where a pre-amorphization implant (PAI) process is performed. The PAI process may provide surface roughening. Referring to the example of FIG. 8c, the roughening area 810 may be formed. The method 700 proceeds to step 710 where phosphorus in its vapor phase is introduced to the substrate. A diffusion layer including phosphorus is formed by vapor phase process (doping process) on the substrate. In the example of FIG. 8d, a diffusion layer 812 forms on the substrate 800 including the area surrounding the fin 806.

The method 700 proceeds to step 712 where the substrate is annealed. The annealing process may allow the solid phase diffusion (drive-in) of dopants present in the BSG layer into a fin, as well as driving-in dopants in the diffusion layer into a fin on the substrate. Referring to the example of FIG. 8e, the annealing process allows solid phase diffusion of the boron present in the BSG layer 808 into the fin 806, shown as doped region 806a. The annealing process also allows the driving in of the phosphorus present in the diffusion layer 812 into the fin 804, shown as doped region 804a. Thus, the fin 804 becomes N-doped and the fin 806 becomes P-doped. Therefore, method 700 provides a solid phase diffusion process for forming a portion of a PMOS FinFET element and a vapor phase diffusion process for forming a portion of a NMOS FinFET element.

The method 700 proceeds to step 714 where the BSG layer is removed from the substrate. In an embodiment of the method 700, step 714 is omitted. Referring to the example of FIG. 8f, the BSG layer 808 is removed from the substrate 800. In the illustrated embodiment, the STI structures 802b and 802c are partially etched. The partial etching may remove residual phosphorus.

Although only a few exemplary embodiments of this invention have been described in detail above, those skilled in the art will readily appreciate that many modifications are possible in the exemplary embodiments without material departing from the novel teachings and advantages of this disclosure.

Thus, the present disclosure provides a method of fabricating a FinFET element including providing a substrate including a first fin and a second fin. A first layer is formed on the first fin. The first layer comprises a dopant of a first type. A dopant of a second type is provided to the second fin. High temperature processing of the substrate is performed on the substrate including the formed first layer and the dopant of the second type. In an embodiment, the first layer includes a silica glass such as BSG or PSG.

Also provided is a method of fabrication a FinFET element including providing a substrate including a first fin and a second fin. A phosphosilicate glass (PSG) layer is formed on the substrate including an area surrounding the first fin. Boron is diffused by vapor phase processing into the substrate including an area surrounding the second fin. The substrate is annealed including the PSG layer and diffused boron, wherein the annealing drives phosphorus from the PSG layer into the first fin and the diffused boron into the second fin.

Also provided is method of fabricating a FinFET element including diffusing a first dopant into a first fin on a semiconductor substrate by a solid phase diffusion process. The method also provides for diffusing a second dopant into a second fin on the semiconductor substrate by at least one of a solid phase diffusion process and a vapor phase diffusion process.

What is claimed is:

1. A method of fabricating a FinFET element comprising:
providing a substrate including a first fin and a second fin;
forming a first silica glass layer on the first fin, wherein the forming the first silica glass layer includes forming a plasma-enhanced phosphosilicate glass (pe-PSG) layer;
forming an oxide layer on the pe-PSG layer and the second fin;
providing a dopant of a second type
performing a vapor phase diffusion process to diffuse the dopant of the second type into the oxide layer to form a doped layer; and
after forming the pe-PSG layer and forming the doped layer, performing high temperature processing of the substrate, wherein the performing high temperature processing of the substrate provides for driving a dopant of the pe-PSG into the first fin and the dopant of the second type into the second fin by a solid phase diffusion process to form channels of transistor devices.

2. The method of claim 1, wherein the forming the first silica glass layer comprises:
depositing the pe-PSG layer on the substrate including an area surrounding the first fin and an area surrounding the second fin; and
etching the pe-PSG layer from the area surrounding the second fin.

3. The method of claim 2, further comprising:
removing the first silica glass layer from the annealed substrate.

4. The method of claim 1, wherein the dopant of the second type includes boron.

5. The method of claim 1, further comprising:
performing a pre-amorphization implant (PAI) prior to providing the dopant of the second type.

6. The method of claim 1, wherein the high temperature processing includes a rapid thermal annealing process.

7. A method of fabricating a FinFET element comprising:
providing a substrate including a first fin and a second fin;
forming a phosphosilicate glass (PSG) layer on the substrate including an area surrounding the first fin, wherein the forming the PSG layer includes using a plasma-enhanced process;

growing an undoped silicon oxide layer on the substrate, wherein the silicon oxide layer is formed on the substrate including an area surrounding the second fin;

performing a vapor phase processing on the substrate thereby introducing boron into the silicon oxide layer to form a boron doped layer; and annealing the substrate including the PSG layer and the boron doped layer, wherein the annealing drives phosphorus from the PSG layer into the first fin using solid phase processing and boron from the boron doped layer into the second fin using the vapor phase processing and the solid phase processing.

8. The method of claim 7 wherein the undoped silicon oxide layer is disposed on the formed PSG layer.

9. The method of claim 8, wherein the undoped silicon oxide is between approximately 10 Angstroms and approximately 30 Angstroms in thickness.

10. The method of claim 7, wherein the PSG layer is between approximately 500 Angstroms and 1000 Angstroms in thickness.

11. The method of claim 7, where in the annealing the substrate forms a N-doped first fin and a P-doped second fin; the first fin including a channel of a NMOS FinFET device and the second fin including a channel of a PMOS FinFET device.

12. A method, comprising:

providing a semiconductor substrate including a first fin and a second fin;

depositing a plasma-enhanced phosphosilicate glass (PSG) layer on the semiconductor substrate including on the first fin;

growing an undoped silicon oxide layer on the second fin;

providing boron in a vapor phase to the semiconductor substrate;

diffusing the boron into the undoped silicon oxide layer to form a boron-doped silicon oxide; and annealing the substrate including the PSG layer and the boron-doped silicon oxide, wherein the annealing drives phosphorus from the PSG layer into the first fin and boron from the boron-doped silicon oxide into the second fin.

* * * * *